United States Patent
Feng

(10) Patent No.: US 10,584,847 B2
(45) Date of Patent: Mar. 10, 2020

(54) EXTREMELY WIDE DISTRIBUTION LIGHT-EMITTING DIODE (LED) LENS FOR THIN DIRECT-LIT BACKLIGHT

(71) Applicant: Lumileds Holding B.V., Schipol (NL)

(72) Inventor: Chunxia Feng, Shanghai (CN)

(73) Assignee: Lumileds Holding B.V., Schipol (NL)

( * ) Notice: Subject to any disclaimer, the term of this patent is extended or adjusted under 35 U.S.C. 154(b) by 0 days.

(21) Appl. No.: 16/527,785

(22) Filed: Jul. 31, 2019

(65) Prior Publication Data

US 2019/0353326 A1    Nov. 21, 2019

Related U.S. Application Data

(63) Continuation of application No. 15/960,985, filed on Apr. 24, 2018, now Pat. No. 10,400,986.

(30) Foreign Application Priority Data

Aug. 4, 2017 (WO) ................ PCT/CN2017/095923
Sep. 13, 2017 (EP) ..................................... 17190880

(51) Int. Cl.
    *H01L 33/60*     (2010.01)
    *F21V 5/04*     (2006.01)
    (Continued)

(52) U.S. Cl.
    CPC ................ *F21V 5/046* (2013.01); *F21V 7/28* (2018.02); *F21V 13/04* (2013.01); *G02F 1/1336* (2013.01);
    (Continued)

(58) Field of Classification Search
None
See application file for complete search history.

(56) References Cited

U.S. PATENT DOCUMENTS

| 7,549,769 B2 | 6/2009 | Kim et al. |
| 9,956,731 B2 | 5/2018 | Yamada et al. |
| (Continued) | | |

FOREIGN PATENT DOCUMENTS

| JP | 2016171227 | 9/2016 |
| TW | 201918660 | 5/2019 |
| WO | 2019025325 | 2/2019 |

OTHER PUBLICATIONS

"International Application Serial No. PCT EP2018 070485, International Search Report dated Sep. 10, 2018", 3 pgs.

(Continued)

*Primary Examiner* — Elmito Breval
(74) *Attorney, Agent, or Firm* — Schwegman Lundberg & Woessner, P.A.

(57) ABSTRACT

Disclosed lens designs enable uniform light distribution without hot spot, achieving wider transfer functions of light compared with traditional lenses, with a benefit of reducing the number of light sources needed and overall cost for direct-lit backlight device. A disclosed lens includes a beam shaping element on the top thereof and a backlight device incorporating the lens and the beam shaping element to eliminate a light hot spot produced by the backlight device and obtain a uniform light distribution at the illumination field. The disclosed lens is especially useful when extremely wider transfer function or extremely thin backlight is needed.

20 Claims, 3 Drawing Sheets

(51) Int. Cl.
  *H01L 33/58* (2010.01)
  *G02F 1/13357* (2006.01)
  *F21V 7/28* (2018.01)
  *F21V 13/04* (2006.01)
  *F21Y 115/10* (2016.01)

(52) U.S. Cl.
  CPC .............. *H01L 33/58* (2013.01); *H01L 33/60* (2013.01); *F21Y 2115/10* (2016.08)

(56) References Cited

U.S. PATENT DOCUMENTS

| | | |
|---|---|---|
| 10,400,986 B2 | 9/2019 | Feng |
| 2006/0083000 A1 | 4/2006 | Yoon et al. |
| 2010/0172135 A1* | 7/2010 | Holder ............... F21K 9/00 362/249.14 |
| 2010/0238669 A1* | 9/2010 | Holder ............... F21K 9/00 362/311.02 |
| 2014/0153223 A1 | 6/2014 | Lin |
| 2014/0177234 A1 | 6/2014 | Wang He |
| 2015/0131261 A1 | 5/2015 | Duong et al. |
| 2017/0082896 A1 | 3/2017 | Jang et al. |
| 2019/0041029 A1 | 2/2019 | Feng |

OTHER PUBLICATIONS

"International Application Serial No. PCT EP2018 070485, Written Opinion dated Sep. 10, 2018", 5 pgs.

"U.S. Appl. No. 15/960,985, Preliminary Amendment filed Jul. 11, 2018", 5 pgs.

"U.S. Appl. No. 15/960,985, Non Final Office Action dated Nov. 16, 2018", 9 pgs.

"U.S. Appl. No. 15/960,985, Response filed Feb. 15, 2019 to Non Final Office Action dated Nov. 16, 2018", 9 pgs.

"U.S. Appl. No. 15/960,985, Notice of Allowance dated Apr. 25, 2019", 7 pgs.

* cited by examiner

US 10,584,847 B2

EXTREMELY WIDE DISTRIBUTION LIGHT-EMITTING DIODE (LED) LENS FOR THIN DIRECT-LIT BACKLIGHT

PRIORITY APPLICATION

This application is a continuation of and claims priority to U.S. patent application Ser. No. 15/960,985, filed Apr. 24, 2018, which claims priority to European Patent Application Serial Number 17190880.9, filed on Sep. 13, 2017, and PCT/CN2017/095923, filed on Aug. 4, 2017, the disclosure of which are incorporated herein in their entireties by reference.

FIELD

The disclosure herein relates generally to a light emitting device and an optical lens for improving luminance uniformity.

BACKGROUND

Light-emitting diode (LED) light sources are commonly and widely used for direct-lit backlight illumination. Computers, personal digital assistants (PDAs), mobile phones, and thin liquid crystal display (LCD) televisions (TVs) are a few examples of backlight screen devices that use direct-lit LED backlights. However, the light intensity distribution range of LEDs is narrow, so a lens may be used on an LED to help distribute the light.

In direct-lit backlight, an array of lenses is placed in front of the light sources to provide a more uniform light output on the surface of the backlight device. A large number of LEDs may be needed depending on the size of the light spot right above the lens or if the radian angle of the lens is narrow, thus increasing the cost. The number of LEDs needed for a backlight can be decreased by increasing the spot size of each individual LED device.

SUMMARY

The disclosure herein describes optical lens and light emitting device designs to achieve uniform light distribution without producing a light hot spot with a benefit of reducing the number of light sources needed and overall cost for direct-lit backlight devices. The disclosure herein relates to an optical lens with a beam shaping element on the top thereof, and a backlight device, or other light emitting device, incorporating said lens and beam shaping element, to produce a uniform distribution of light at a target surface. The disclosed lens and light emitting device is particularly useful when a wide or extremely wide transfer function of backlight is needed.

DETAILED DESCRIPTION OF THE EMBODIMENTS

Figure 1:
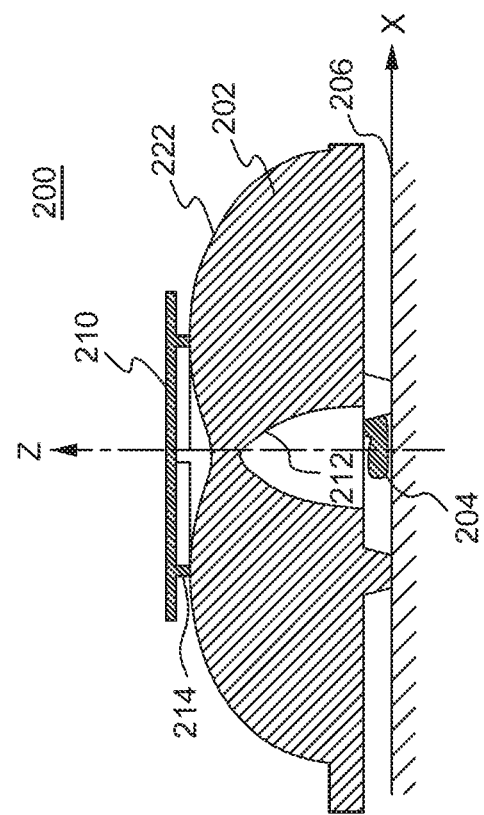
FIG. 1 is a cross-sectional view of an example light-emitting diode (LED) device with a concave optical lens.

Herein, LED device may be used interchangeably with light-emitting device, or backlight device, such that an LED light source or any other type of light source may be similarly used in a light-emitting device. Rapid developments in the direct-lit backlight industry have created a need for innovative wider and more uniform lens designs. A much wider light distribution provided by an LED lens can significantly reduce the cost of a backlight by reducing the overall number of LED devices needed in the backlight. FIG. 1 is a cross-sectional view of an example LED device 100 (or light emitting device 100) with a concave optical lens 102 (cross-section shown in the X-Z plane). The LED device 100 may include, but is not limited to include, the following components: a lens 102, including an inner curved surface 112 (also referred to as a light incident surface 112) and an outer curved surface 122 (also referred to as a light exit surface 122); a light source 104 (e.g., LED); a base surface 114; and for a diffuser plate 116 (or more generally a light receiver 116).

The light source 104 may be disposed at a central and lower portion of the optical lens 102 (e.g., centered on the optical axis Z of the lens 102). For example, a red LED, a blue LED, or a green LED may be employed as the light source 104. The light source 104 may be electrically connected to a circuit board (not shown) through sockets and terminals (not shown) to apply electrical power to the light source 104. The diffuser plate 116 may be used, in screen backlights, to evenly distribute light from the light source 104 to reduce or eliminate bright spots, and may be composed of many sheets of plastic in varying thickness, opacity or reflectivity, for example.

The shape of the concave optical lens 102 increases the light scattering angles, shown by arrows, of the light emitted from the light source 104 thereby enlarging the light spot above the LED device 100. Light emitted from the light source 104 is refracted first at the light incident surface 112 and then at the light exit surface 122 of the lens 102, so that the rays from the light source 104 are fanned out and distributed over a wider area (e.g., in comparison to a single LED light source without a lens) In an example, the outer curved surface 122 may include a recessed portion centered on the optical Z axis that recesses inwardly toward the light incident surface 112 of the lens 102.

However, a part of the light generated from the light source 104 is likely to be reflected due to total internal reflection occurring at the lens-air interface, mostly around the center (Z axis) of the light exit surface 122. Part of the reflected light is further reflected back by the bottom surface to the center of the illumination field, thus contributing to the "hot spot" of fairly intense light in the center of the illumination field (at and around the Z axis). Thus, lens 102 works well for distributing light when the radiant angle needed is not too wide. However, when the spot size required is large enough, the backlight device 100 using concave lens 102 may create an unsatisfactorily non-uniform light distribution pattern.

With the introduction of energy conservation policies, reducing cost becomes an important challenge. In many applications, the spot size requirement increases in order to save cost by reducing the number of LEDs and lenses used. Thus, reducing the hot spot in LED devices continues to be an outstanding issue with existing lens structures and LED device design. An example approach to reducing cost is the use of low cost middle power LEDs to replace high power LEDs. However, the larger die size typically adopted by middle power LEDs (compared to the small die size of high power LEDs) may further aggravate the hot spot phenomenon. Other example approaches for reducing cost may include, but are not limited to, reducing the number of LEDs, printed circuit board (PCB) sets, and/or foils (films) used.

Therefore, an object of the present disclosure is to provide an optical lens for a light source that can alleviate the aforementioned drawbacks of existing optical lenses and achieve uniform light distribution on the luminance field. Rapid developments in the direct-lit backlight industry have caused a need for innovative, wider and more uniform lens designs. The lens designs disclosed herein enable uniform light distribution without producing a light hot spot, and thus have a wider transfer function of light compared with other lenses and decrease the overall cost of the direct-lit backlight device.

The present disclosure relates to an LED lens with beam shaping element on the top surface thereof, and a backlight device, or other light emitting device, incorporating said lens to produce a uniform distribution of light at a target surface. The light emitting device includes a light source (e.g., LED light source), and a lens body, such that the LED light source is accommodated in the incident surface thereof, and light emitted from the LED light source is radiated in vertical direction of the lens body. The beam shaping element is fastened to the top of the lens body and is configured to adjust light beams radiated through the exiting surface (light exit surface) of the lens body. The amount of light radiated in the vertical direction may be adjusted using at least the beam shaping element according to the requirements of the backlight. The beam shaping element radiates light back or into other directions to decrease the center intensity and alleviate the hot spot on the illumination field of the light emitting device, thus improving overall backlight uniformity. The disclosed lens is particularly useful when extremely wide transfer function of backlight is needed. The present disclosure is described in more detail below. While the disclosure is described with respect to backlight devices and LED light sources, it is understood by one skilled in the art that the disclosed lens designs may be similarly used with other light sources and light source devices.

Figure 2:
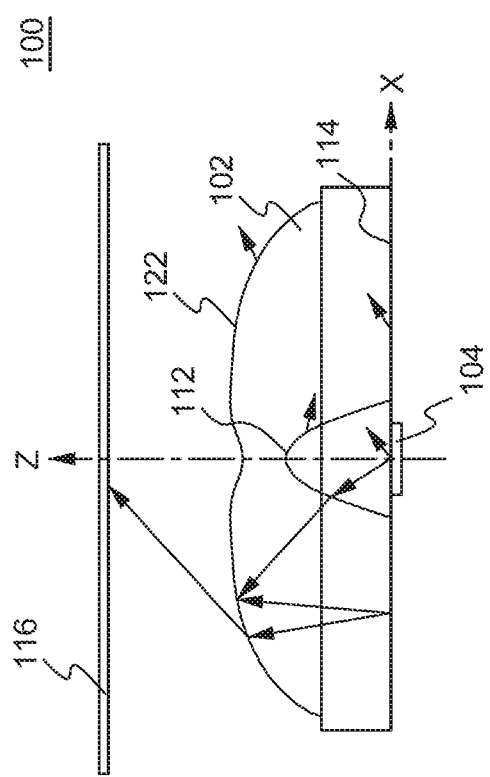
FIG. 2 is a cross-sectional view of an example backlight device optical lens and beam shaping element.

FIG. 2 is a cross-sectional view of an example light emitting device 200 (e.g., a backlight device), in accordance with the disclosure herein. The backlight device 200 may include, but is not limited to include, the following components: an optical lens 202, including a light incident surface 212 (also referred to as an inner curved surface 212) and a light exit surface 222 (also referred to as an outer curved surface 222); an LED light source 204 coupled to the lens 202; a substrate 206 coupled to the lens 202 and the LED light source 204; and/or a beam shaping element 210 located above the lens 202 and fastened to the top of the lens 202 by way of protrusions 214. The backlight device 200 may further include other elements not shown. For example, the backlight device 200 may include a diffuser plate (not shown), which may be located above the beam shaping element 210.

The LED light source 204 is located at the center of circular (X, Y, Z) coordinates, and is centered on the optical axis Z of the lens 202. The incident surface 212 of lens 202 is configured to accommodate the LED light source 204 in the lower portion thereof. The LED light source 204 may be formed on a substrate 206. The substrate 206 may be a flat plate, and may be made of electrically insulating materials, including, but not limited to, the following example materials: ceramics, silicon, sapphire, and/or silicon carbide. The top surface of the substrate 206 electrically connects with the LED light source 206 and provides the electrical power to the LED light source 204.

The lens 202 is centrosymmetric about the Z axis. The incident surface 212 is located at a central portion of the LED light source 204, and receives the light coming out from the LED light source 204. The light exit surface 222 is disposed to form a predetermined light distribution and is also symmetrical with respect to the central Z axis. The curves and the relative position of the incident surface 212 and the light exit surface 222 may be adjusted according to the radiant angle requirements for the backlight device 200. In an example, the light exit surface 222 may include a recessed portion centered on the optical Z axis that recesses inwardly toward the light incident surface 112 of the lens 102. The beam shaping element 210 may be fastened to the top of the light exit surface 222 of the lens 202 by the protrusions 214, so that the lens 202 and the beam shaping element 210 can more accurately perform their respective light diffusion functions.

Examples of material used for the beam shaping element 210 include polymethyl methacrylate (PMMA), polyethylene terephthalate (PET), polycarbonate (PC), polystyrene (PS), or glass. The material used for the beam shaping element 210 may be the same as or different than the material used for the lens 202. In an example, three or more protrusions 214 may be used to fasten the beam shaping element 210 to the lens 202, although any number of protrusions 214 may be used. In an example, the height of each of the multiple protrusions 214 may be the same in order to make the beam shaping element 210 horizontal to the substrate 206. In another example, the protrusions 214 may be as thin as possible to avoid blocking the light. In another example, the protrusions 214 may be fixed to the lens 202 with ultra-violet (UV) glue, or other adhesive materials. However, height, thickness, and number of protrusions may be adjusted to other values within the scope of the disclosures herein.

The beam shaping element 210 may be fastened to the central portion of the light exit surface 222, and may be centered on the optical Z axis. According to the disclosures herein, a portion of the light originating from the light source 204 and emitted from the light exit surface 222 is reflected back by the beam shaping element 210 while another portion of the light radiates directly through the beam shaping element 210. This may be achieved by forming the bottom surface 216 of the beam shaping element 210 to partially radiate and partially reflect light. In an example, the beam shaping element 210 may be formed with a dot pattern on the bottom surface 216 of the beam shaping element 210, such that the dot pattern allows a portion of the light to radiate through the beam shaping element 210 (e.g., through the spaces between the dots) while reflecting the other portion of the light (e.g., by the dots). Example design of dot patterns is described in more detail below with references to FIGS. 4A and 4B. The size and/or position of the beam shaping element 210 may be adjusted according to the hotspot size coming out of the lens 202 in order to reduce or eliminate the light hot spot at the center portion the lens 202.

Figure 3:
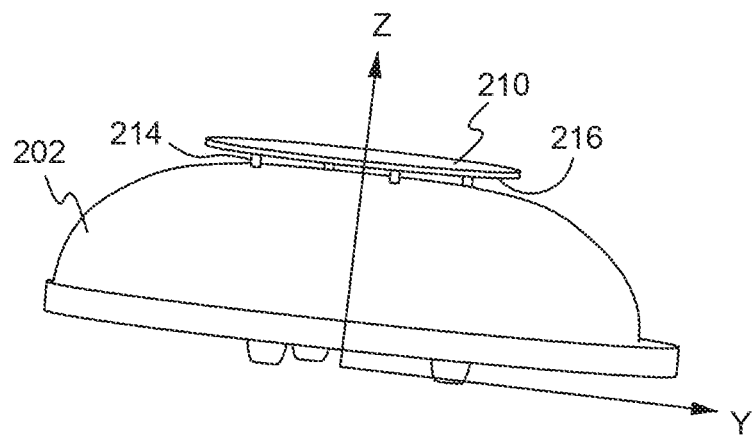
FIG. 3 is a three-dimensional (3D) perspective (side) view of the example backlight device 200 shown in FIG. 2.

FIG. 3 is a three-dimensional (3D) perspective (side) view of the example backlight device 200 shown in FIG. 2. Light emitted from the light exit surface 222 of the lens 202 incidents on to the bottom of the beam shaping element 210 and forms a light region to which the light is modulated according to the distribution of the pattern (e.g., a dot pattern) on the bottom surface 216 of the beam shaping element 210. For example, if a dot pattern is used, a portion of the light is reflected back where there is a dot, and another portion of light radiated through beam shaping element 210 where there is an absence of a dot. As a result, the luminance (i.e., intensity of light emitted from a surface per unit area in a given direction) is prevented from being concentrated on the central Z axis of the lens 202, thus eliminating the hot spot above the lens 202. The size, height and/or thickness of the beam shaping element 210 may varied and adjusted, based for example on the requirements of the backlight device 200.

In an example, the beam shaping element 210 may be located as close as possible to the lens 202 within the assembling tolerance (e.g., a distance of 0.2 mm or between the beam shaping element 210 from the lens 202). In another example, the thickness of the beam shaping element 210 may be made as thin as possible to avoid absorbing more light. The size of the beam shaping element 210 may be optimized according to the hot spot size of the lens 202. For example, the size of the beam shaping element 210 may be proportionate to the hot spot size (i.e., a larger beam shaping element 210 is used for a larger hot spot size).

Figures 4A, 4B:
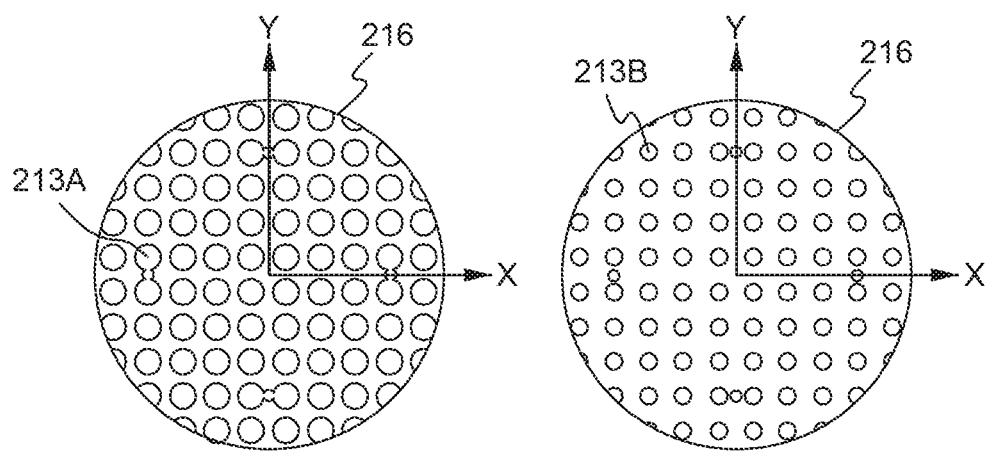
FIGS. 4A and 4B are planar views of the bottom surface of the beam shaping element in the example backlight device shown in FIG. 2 showing examples dot patterns.

FIGS. 4A and 4B are planar views of the bottom surface 216 of the beam shaping element 210 in the example backlight device 200 shown in FIG. 2, and illustrate example dot patterns 213A and 213B. As described above, a pattern, such as dot patterns 213A or 213B, may be formed on the bottom surface 216 of the beam shaping element 210. The dot patterns 213A and 213B are distributed such that light is reflected back by the dots on the bottom surface 216 of the beam shaping element 210 where light is too bright. A dot pattern may be implemented by varying the number, size, location, and/or shape of the dots. For example, dot pattern 2131 shows larger dots that are closer together compared to the dot pattern 213B. Although circular dots are shown, other shapes of dots may be used (e.g., diamonds, ellipses, rectangular etc.) Moreover, while dot patterns 213A and 213B are shown to be regular, irregular dot patterns may be used. In an example, the dot pattern may be made using a reflecting coating, such as the aluminized surface (aluminum film) that reflects light instead transmitting light. For example, an aluminum film may reflect more than 85% of the light coming into it. In another example, the dot may made using an ink coating absorbs part of the light coming into it (e.g., 40%-50% of light), and reflects back the remainder of the light.

Figure 5:
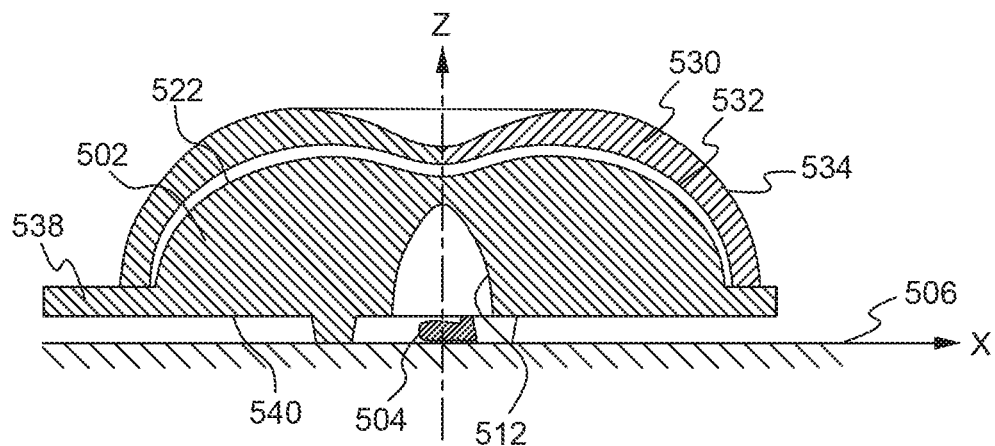
FIG. 5 is a cross-sectional view of another example backlight device with optical lens and beam shaping element.

FIG. 5 is a cross-sectional view of another example light emitting device 500 (e.g., a backlight device), in accordance with the disclosure herein. The backlight device 500 may include, but is not limited to include, the following components: a lens 502, including a light incident surface 512 (also referred to as an inner curved surface 512), a light exit surface 522 (also referred to as an outer curved surface 522), a supporting base 538, and a bottom surface 540; an LED light source 504 coupled to the lens 502; a substrate 506 coupled to the lens 502 and the LED light source 504; and/or a beam shaping element 530 including an inner surface 532 and an outer surface 534. The backlight device 200 may further include other elements not shown.

The LED light source 504 is located at the center of circular (X, Y, Z) coordinates, and is centered on the optical axis Z of the lens 502. As shown in FIG. 5, the lens 502 and the beam shaping element 530 are centrosymmetric about the central Z axis. The beam shaping element 530 may be fixed on the supporting base 538 of the lens 502. The inner surface 532 of the beam shaping element 530 may be spaced from the light exit surface 522 of the lens 502. In other words, there may be a gap between the inner surface 532 of the beam shaping element 530 and the light exit surface 522 of the lens 502. For example, the gap may be 0.2 mm or larger to avoid assembling collision of the beam shaping element 530 and the lens 502.

The outer surface 534 of the beam shaping element 530 may have a same or a different curvature than the curvature of the light exit surface 522. In an example, the outer surface 534, the inner surface 532 and the light exit surface 522 do not have the same curvature. For example, either the outer surface 534 or the inner surface 532 may have the same curvature as the light exit surface 522, or both the outer surface 534 and the inner surface 532 have different curvatures than the exit surface 522.

Light generated from the LED light source 504 is refracted into the lens 502 through the light incident surface 512. Part of the light is directly, refracted out of the lens 502 through the light exit surface 522 and onto the beam shaping element 530, while some or most of the light is reflected back by the light exit surface 522 due to total internal reflection. Part of the reflected light is further reflected back by the bottom surface 540 of the lens 502 to the central portion (around the Z axis) of the beam shaping element 530 through the inner surface 532 of the beam shaping element 530. The light refracted to the beam shaping element 530 is further transmitted through the beam shaping element 530. Light with an incident angle larger than a critical angle for total internal reflection at the air-surface interface of the outer surface 534 is reflected back due to total internal reflection. Thus, the reflection by the beam shaping element 530 eliminates the hotspot above the light-emitting device 500.

In an example, the inner surface 532 and the outer surface 534 of the beam shaping element 530 may be smooth surfaces. The beam shaping element 530 may be recessed at a central portion around the Z axis, such that a vertical cross section through the central axis Z of the beam shaping 530 has a substantially "M" shaped configuration. In an example, the beam shaping element 530 may be as thin as possible at the thinnest position in order to save material and reduce material absorbing. For example, the beam shaping element 530 may be 0.4 mm thick. The space or gap between the beam shaping element 530 and the lens 502 may be at least 0.2 mm to account for assembling tolerance.

Figure 6:
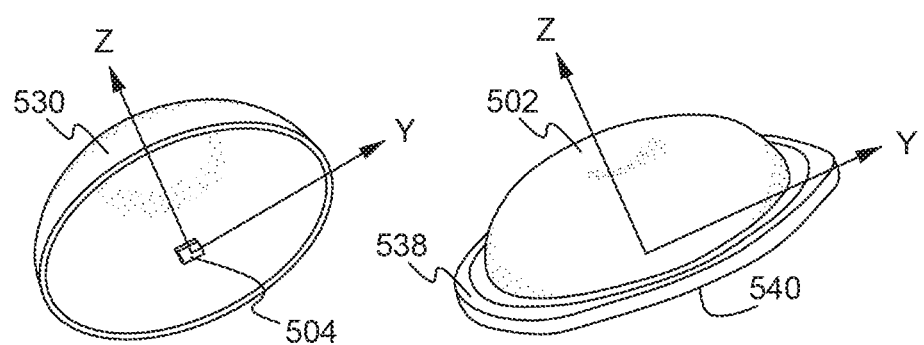
FIG. 6 are 3D perspective (bottom and side) views of the example backlight device shown in FIG. 5.

FIG. 6 are 3D perspective (bottom and side) views of the beam shaping element 530 (on the left) and the lens 502 (on the right) from the example backlight device 500 shown in FIG. 5. The light emitted from the LED light source 504 is sequentially diffused by the incident surface 512 and light exit surface 522 of the lens 502, and then by the inner surface 532 and outer surface 534 of the beam shaping element 530. The light is divergently diffused in different degrees by the lens 502 and the beam shaping element 530, and thus becomes more uniformly distributed. The beam shaping element 530 may be fixed on the top surface of the supporting base 538 of the lens 502.

According to the disclosures herein, a portion of the light emitted through a lens is further reflected and refracted from the beam shaping element of the optical lens so that hot spot is eliminated. The embodiments described above provide examples of the disclosed beam shaping element, such that other shapes, materials and structures may be used to redirect light within the scope of the disclosures herein.

In the disclosure described herein, the optical lens and/or the beam shaping element may be made from any material, including, but not limited to, the following materials: PMMA; PET; PC; and/or glass. The material used for the beam shaping element may be the same or different than the material used for the lens. The disclosure described herein includes example embodiments, such that a person skilled in the art could modify, alter, omit or replace the described elements with equivalent elements.

What is claimed is:

1. A system, comprising:
a lens configured to shape light emitted from a light-emitting diode to form shaped light; and
a beam-shaping element coupled to the lens and positioned to receive at least some of the shaped light,
the beam-shaping element including an incident surface that faces the lens,
the incident surface including a pattern of reflective elements that are configured to reflect a first portion of the shaped light toward the lens,
the incident surface allowing a second portion of the shaped light to propagate through the beam-shaping element through one or more spaces between adjacent reflective elements in the pattern.

2. The system of claim 1, wherein the reflective elements are arranged in a substantially rectilinear pattern.

3. The system of claim 1, wherein the reflective elements are arranged in an irregular pattern.

4. The system of claim 1, wherein the reflective elements have a same size and a same shape.

5. The system of claim 1, wherein the reflective elements include so substantially circular reflective dots.

6. The system of claim 1, wherein the pattern of reflective elements is formed in a reflective coating positioned on the incident surface of the beam-shaping element.

7. The system of claim 6, wherein the reflective coating includes an aluminum film.

8. The system of claim 1, wherein the beam-shaping element is positioned and, sized to receive only a portion of the shaped light from the lens.

9. The system of claim 8, wherein the shaped light, at a plane of the beam-shaping element, extends over an area that is larger than an area of the beam-shaping element.

10. The system of claim 8, wherein the beam-shaping element is positioned and sized to receive only a central portion of the shaped light from the lens.

11. The system of claim 1, wherein:
the lens defines an optical axis; and
the beam-shaping element is centered on the optical axis.

12. The system of claim 1, wherein:
the lens is radially symmetric about an optical axis; and
the beam-shaping element is radially symmetric and is centered on the optical axis.

13. The system of claim 1, further comprising a plurality of protrusions that fasten the beam-shaping element to an exiting surface of the lens.

14. The system of claim 13, wherein:
the exiting surface of the lens includes a concave central portion surrounded by a convex peripheral portion; and
the plurality of protrusions fasten the beam-shaping element to the convex peripheral portion of the exiting surface of the lens.

15. The system of claim 1, further comprising a light-emitting diode configured to emit light toward the lens to form the shaped light.

16. A method, comprising:
producing light with a light-emitting diode;
shaping the light with a lens to form shaped light, the shaped light including a central portion and a peripheral portion surrounding the central portion;
reflecting, with a pattern of reflective elements positioned on an incident surface of a beam-shaping element that is coupled to the lens, at least some of the central portion of the shaped light toward the lens; and
transmitting, through one or more spaces between adjacent reflective elements in the pattern, at least some of the central portion of the shaped light through the beam-shaping element.

17. The method of claim 16, wherein:
the produced light is rotationally symmetric about an optical axis; and
the lens, the shaped light, and the beam-shaping element are rotationally symmetric about the optical axis.

18. The method of claim 17, further comprising:
directing the peripheral portion of the shaped light around the beam-shaping element, such that the peripheral portion of the shaped light does not strike the beam-shaping element.

19. A system, comprising:
a light-emitting diode configured to emit light that is centered around an optical axis;
a lens configured to shape the light the emitted light to form shaped light, the lens being rotationally symmetric about the optical axis; and
a beam-shaping element coupled to the lens,
the beam-shaping element being rotationally symmetric about the optical axis,
the beam-shaping element being positioned and sized to receive only a central portion of the shaped light,
the beam-shaping element including an incident surface that faces an exiting surface of the lens,
the incident surface including a pattern of reflective elements that are configured to reflect a first portion of the shaped light toward the lens,
the incident surface allowing a second portion of the shaped light to propagate through the beam-shaping element through one or more spaces between adjacent reflective elements in the pattern.

20. The system of claim 19, further comprising a plurality of protrusions that fasten the beam-shaping element to the exiting surface of the lens.

* * * * *